United States Patent [19]

Yamamoto et al.

[11] Patent Number: 4,740,749
[45] Date of Patent: Apr. 26, 1988

[54] NMR IMAGING METHOD

[75] Inventors: Etsuji Yamamoto, Akishima; Hideki Kohno, Suginami, both of Japan

[73] Assignee: Hitachi, Ltd., Tokyo, Japan

[21] Appl. No.: 56,951

[22] Filed: Jun. 3, 1987

[30] Foreign Application Priority Data

Jun. 4, 1986 [JP] Japan .................................. 61-127928

[51] Int. Cl.⁴ ........................................... G01R 33/20
[52] U.S. Cl. ..................................... 324/309; 324/312
[58] Field of Search ............... 324/300, 306, 309, 307, 324/312, 314

[56] References Cited

U.S. PATENT DOCUMENTS

| | | | |
|---|---|---|---|
| 4,521,733 | 6/1985 | Bottomley | 324/309 |
| 4,579,121 | 4/1986 | Macouski | 324/309 |
| 4,585,992 | 4/1986 | Maudsley | 324/309 |
| 4,587,489 | 5/1986 | Wehrli | 324/309 |
| 4,599,565 | 7/1986 | Hoenninger | 324/309 |

OTHER PUBLICATIONS

W. Edelstein, "European Patent Application", No. 0091008, date 12/10/83.

Primary Examiner—Michael J. Tokar
Attorney, Agent, or Firm—Antonelli, Terry & Wands

[57] ABSTRACT

In an imaging method called spin warp method in which a measuring sequence inclusive of nuclear spin excitation, application of phase-encoding gradient field, and measurement of NMR signals under the application of read-out gradient field, is repeated while changing the phase-encoding amount, and a data train thus obtained is subjected to the two-dimensional inverse Fourier transformation to reconstruct a magnetization distribution image of an object, wherein an NMR imaging method is characterized in that measurement of NMR signals is repeated a plural number of times for a particular phase-encoding amount only among many phase-encoding amounts, a plurality of NMR signals thus obtained are added up together and are averaged, and the data obtained by the addition and averaging is subjected to the two-dimensional inverse Fourier transformation.

5 Claims, 3 Drawing Sheets

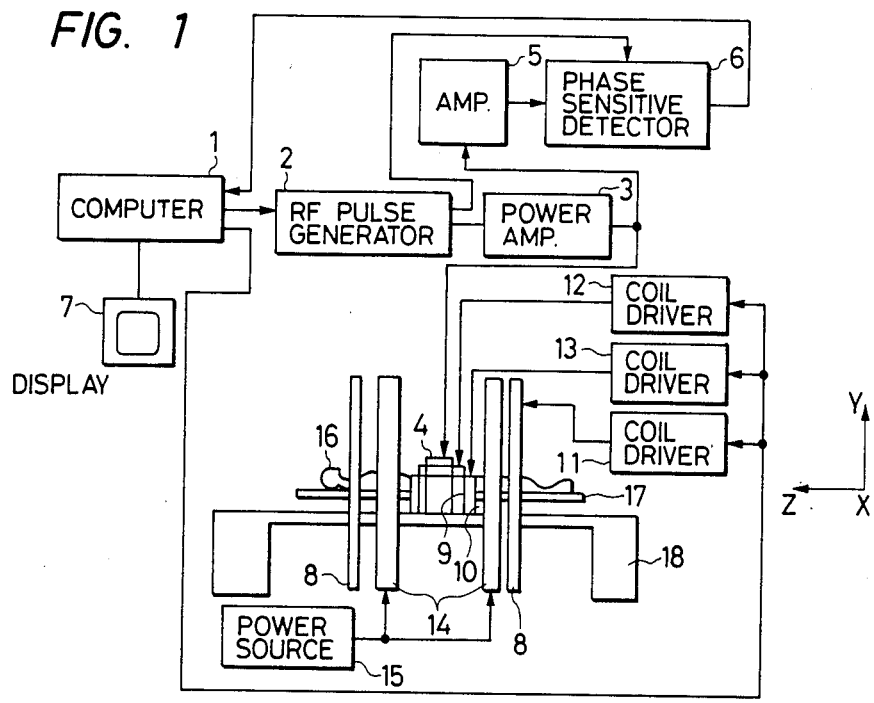
FIG. 1
FIG. 2A  RF
FIG. 2B  Gz
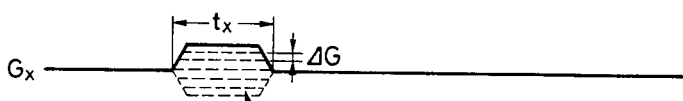
FIG. 2C  Gx
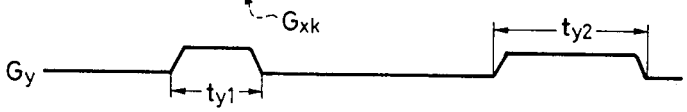
FIG. 2D  Gy
FIG. 2E  SIGNAL
→ TIME

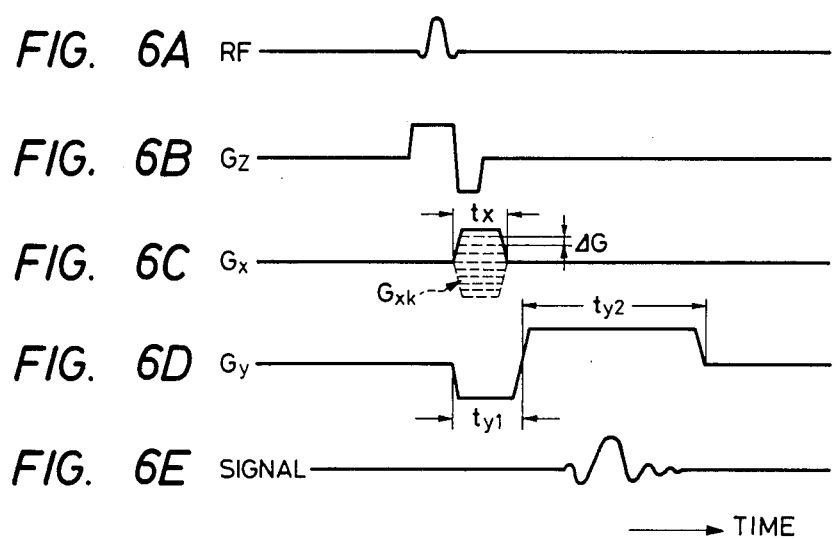

NMR IMAGING METHOD

BACKGROUND OF THE INVENTION

The present invention relates to an imaging method and an imaging apparatus utilizing nuclear magnetic resonance (hereinafter referred to as "NMR"), and particularly to a method of forming an image having visually the highest signal-to-noise ratio within a limited period of measuring time.

An X-ray CT and an ultrasonic wave imaging apparatus have heretofore been widely used to noninvasibly inspect the internal structure such as head and belly of a human body. In recent years, it has been succeeded in performing the same inspection by utilizing the nuclear magnetic resonance phenomenon, making it possible to obtain data that were not obtainable with the X-ray CT and the ultrasonic wave imaging apparatus. In the imaging apparatus which utilizes the nuclear magnetic resonance phenomenon, signals from an object must be separated and discriminated so as to be corresponded to each of the portions of the object. One of the methods consists of applying a gradient field to the object so that each of the portions of the object is placed in a dissimilar static field. Namely, the portions of the object exhibit different resonance frequencies or different phase-encoding amounts, making it possible to obtain the data of positions.

The fundamental principle thereof has been disclosed in the Journal of Magnetic Resonance, Vol. 18, 1975, pp. 69–83 and in the Journal of Physics in Medicine and Biology, Vol. 25, 1980, pp. 751–756, and is not described here.

In such an imaging method, the signals are often added up together to improve the quality of the image.

That is, the whole signals necessary for reconstructing an image are repetitively measured in order to improve the signal-to-noise ratio of the signals. If the noise detected in each measurement does not have a correlation, the signal-to-noise ratio is improved in proportion to one-half power of the number of times of the measurement.

The measuring time, however, increases with the increase in the number of times of addition, and whereby a person being inspected suffers increased pain and the quality of image deteriorates to a degree that is not negligible as the person being inspected moves.

Summary of the Invention

An object of the present invention is to improve the quality of image without permitting the measuring time to be so lengthened.

The above object is accomplished by effecting the addition of signals not for the whole signals that are necessary for reconstructing the image but by effecting the addition of signals for only part of the signals.

If mentioned more concretely, the invention deals with an imaging method called spin warp method in which NMR signals are measured while applying a phase-encoding gradient field in a predetermined direction and then applying a read-out gradient field in another direction different from the above predetermined direction, the signals are repetitively measured while changing the phase-encoding amount, and the thus obtained data train is subjected to the two-dimensional inverse Fourier transformation with the phase-encoding amount and the lapse of time during the measurement as variables, in order to reconstruct the magnetization distribution image of the object, wherein the measurement under a particular phase-encoding amount is repeated a plural number of times, a mean value is calculated from the obtained plurality of NMR signals, and the mean value is used for reconstructing the image.

As described above, the measurement is repeated a plural number of times not for all of the measured signals but for a particular phase-encoding amount only. The measurement is then averaged to obtain an image having reduced noise over a particular space frequency region without permitting the whole measuring time to be unnecessarily lengthened.

BRIEF DESCRIPTION OF THE DRAWINGS

FIG. 1 is a block diagram illustrating the structure of an NMR imaging apparatus for putting an embodiment of the present invention into practice;

FIGS. 2A, 2B, 2C, 2D and 2E are time charts illustrating the measuring sequences repeated according to the embodiment of the present invention;

FIGS. 6A, 6B, 6C, 6D and 6E are time charts illustarting the measuring sequences repeated according to a further embodiment of the present invention.

DESCRIPTION OF THE PREFERRED EMBODIMENTS

Figure 3:
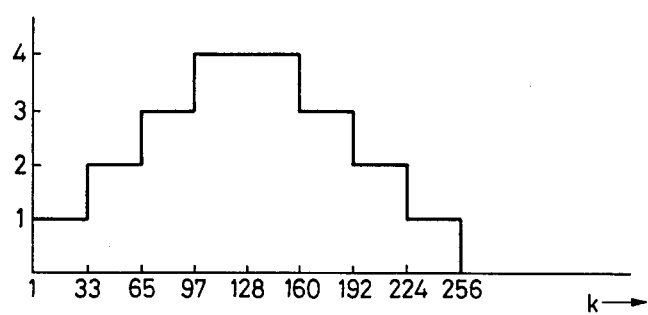
FIGS. 3, 4 and 5 are diagrams illustarting patterns of the number of times of the measurements according to embodiments of the present invention.

FIG. 1 is a diagram illustrating the structure of an inspection apparatus employed for an embodiment of the present invention.

The human body which is an object to be inspected is placed on a bed 17, and is inserted in coils 8, 9, 10 and 14 along a support plate 18. The coils 14 are called static field coils and are served with an electric current from a power source 15. Therefore, the object is placed in a uniform static field in the z-direction. The coils 8, 9 and 10 are called gradient coils and are used for imparting gradient to the strength of the static field in the z-direction, x-direction and y-direction, respectively. These coils are driven by drivers 11, 12 and 13.

A computer 1 has a function to send a variety of instructions to each of the devices maintaining a predetermined timing. The output of an RF pulse generator 2 is amplified through a power amplifier 3 to excite an RF coil 4, whereby the object is irradiated with RF pulses. The RF coil 4 also works to receive NMR signals from the object. The received signal components pass through an amplifier 5, detected by a phase sensitive detector 6, input to the computer 1 and are processed by a signal processing unit in the computer 1. Thus, a desired image is displayed on a display unit 7.

FIGS. 2A to 2D are time charts illustrating the measuring sequences according to an embodiment of the present invention. This embodiment puts into practice an imaging method called two-dimensional modified spin warp method. Here, a section in parallel with an xy-plane is selected and is imaged.

FIG. 2A shows the waveform of RF pulses generated from the RF coils 4, FIG. 2B shows the waveform of a gradient field Gz in the z-direction generated by the gradient coils 8, FIG. 2C shows the waveform of a gradient field Gx in the x-direction generated by the gradient coil 9, Fig. 2D shows the waveform of a gradient field Gy in the y-direction generated by the gradient coil 10, and FIG. 2E shows the waveform of an NMR signal that is detected.

First, the gradient field Gz is applied in the z-direction and a 90° RF pulse is applied, in order to tilt a nuclear spin by 90° in a particular slice perpendicular to the z-axis. Immediately thereafter, the gradient field Gx in the x-direction is applied for a period of time $t_x$. The gradient field Gx is to encode the position data in the x-direction onto the phase of spin, and is called phase-encoding field. A product of the amplitude of the gradient field Gx and the time $t_x$ of application represents a phase-encoding amount. Nearly simultaneously with the application of the gradient field Gx, furthermore, the gradient field Gy is applied in the y-direction over a period $t_{y1}$, followed by the application of a 180° RF pulse. The nuclear spin that is dephased then starts to rephase.

The signal is measured during a period $t_{y2}$ while applying the gradient field Gy in the y-direction that is called read-out gradient field.

The gradient field Gy applied during the period $t_{y1}$ mentioned above works to maintain the nuclear spin dephased in advance, so that an NMR signal from the object will appear after the gradient field Gy has reached the steady state during the period $t_{y2}$. The NMR signal measured as a function of the lapse of time $t_y$ is sampled at a predetermined period, and is stored in the memory of the computer 1.

The above-mentioned series of measuring sequence is carried out while varying the intensity of the phase-encoding field Gx in a plural of steps. A two-dimensional signal $S(Gx, t_y)$ thus obtained establishes the following relationship relative to a nuclear spin distribution $\rho(x, y)$ in the slice, $$S(Gx, t_y) = \int\int \rho(x, y) exp[-j\gamma(G_x x t_x + G_y y t_y)] dx dy. \tag{1}$$

Therefore, using the phase-encoding amount (Gx) and the lapse of time $t_y$ as variables, the signal $S(Gx, t_y)$ is subjected to the two-dimensional inverse Fourier transformation in accordance with the following equation, in order to find a nuclear spin distribution $\rho(x, y)$ in a selected slice, $$\rho(x, y) = \int\int S(Gx, t_y) exp[j\gamma(G_x x t_x + G_y y t_y)] dGx \, dt_y \tag{2}$$

In the foregoing was described the procedure of the imaging method that has heretofore been known as the modified spin warp method. According to this embodiment which is based upon the modified spin warp method, a special method is employed to repeat the measurement of signals in order to decrease noise in the image.

That is, when an image consisting of 256×256 picture elements is to be reconstructed, the measurement must be repeated while changing the phase-encoding amount or changing the amplitude of the phase-encoding field Gx in 256 different ways. Further, measurement of the signal is effected not only one time but n times for each amplitude of the phase-encoding field Gx to obtain a mean value of n times of NMR signals, so that noise in the image decrease to $1/\sqrt{n}$. However, if measurement of signal is repeated n times at each amplitude of the phase-encoding field Gx, the time required for the measurement increases to n times as long. The measuring time is from about 2 to about 4 minutes when the repetition, addition and averaging are not effected. When, for example, n=4, therefore, the measuring time will be from 8 to 16 minutes giving serious effect.

According to this embodiment, therefore, the measurement is repeated a plural number of times only for the phase-encoding field Gx over a predetermined range, a plurality of NMR signals obtained at each amplitude of the phase-encoding field Gx are added up and averaged, and the average value is subjected to the two-dimensional inverse Fourier transformation. That is, if a maximum amplitude of Gx is denoted by Gxm, the pitch of change by ΔG and the number of times of the change by N, then the phase-encoding field Gx changes from Gxm to $-Gxm+\Delta G$, whence the following equation holds true, $$Gxk = Gxm - \Delta G(k-1) \tag{3}$$

where k denotes the order of change of amplitude of Gx, Gxk denotes the amplitude of a k-th Gx, and there holds a relation $1 \leq k \leq N$. Here, if k is close to N/2, the value of Gxk is close to zero; i.e., the amplitude Gxk has a small absolute value. The signal obtained under such conditions gives a low space frequency component in the image. As k separates away from N/2 and approaches 1 or N, on the other hand, the amplitude Gxk approaches ±Gxm and possesses a large absolute value. The signal obtained under such conditions gives a high space frequency component in the image. Therefore, the signal-to-noise ratio for a particular space frequency component can be improved if the measurement is repeated for the same amplitude of Gx, and if the addition of signals is effected for k of a given range only.

FIG. 3 shows a pattern of the numbers of times of measurement repetition (number of times of addition of the measured signals) for each amplitude of the phase-encoding field Gx according to an embodiment of the present invention. Here, the abscissa represents the number of times (k of the equation (3)) the value of Gx is changed in the sequences of FIGS. 2A to 2E, and the ordinate represents the number of times the measurement is repeated (number of times of addition).

In this case, the amplitude of the phase-encoding field Gx is changed in 256 different ways. The measurement is effected one time at each amplitude from k=1, i.e., from a maximum aplitude Gxm of Gx through up to k=32 in accordance with sequences of FIGS. 2A to 2E. The measurement is then effected two times at each amplitude of Gxk from k=33 to k=64. Then, as shown in FIG. 3, the measurement is effected three times at each amplitude of Gxk from k=65 to k=96, effected four times at each amplitude from k=97 to k=160, effected three times at each amplitude from k=161 to k=192, effected two times at each amplitude from k=193 to k=224, and effected one time at each amplitude from k=225 to k=256.

In this embodiment as described above, the measuring sequences shown in FIGS. 2A to 2F are repeated a total of 640 times. A set $\overline{S(Gx, t_y)}$ of signals obtained by the repetition can be given by the following equation, $$S(Gx, t_y) = \frac{1}{32} \sum_{k=1}^{32} S_1(Gxk, t_y) + \tag{4}$$

$$\frac{1}{64} \sum_{k=33}^{64} \sum_{i=1}^{2} Si(Gxk, t_y) + \frac{1}{96} \sum_{k=65}^{96} \sum_{i=1}^{3} Si(Gxk, t_y) +$$

$$\frac{1}{256} \sum_{k=97}^{160} \sum_{i=1}^{4} Si(Gxk, t_y) + \frac{1}{96} \sum_{k=161}^{192} \sum_{i=1}^{3} Si(Gxk, t_y) +$$

-continued
$$\frac{1}{64} \sum_{k=193}^{224} \sum_{i=1}^{2} Si(Gxk, t_y) + \frac{1}{32} \sum_{k=225}^{256} Si(Gxk, t_y)$$

where $Si(Gxk, t_y)$ denotes an NMR signal obtained through an i-th measurement under the condition where the phase-encoding field has an amplitude Gxk.

Among these signals $\overline{S(Gx, t_y)}$, the signals measured at each Gxk are read out from the memory of the computer 1, and are added up and averaged for each sampling point by the signal processing unit. That is, there are obtained signals expressed by, $$\overline{S'(Gx, t_y)} = \frac{1}{2} \sum_{i=1}^{2} Si(Gxk, t_y) \begin{pmatrix} 33 \leq k \leq 64 \\ 193 \leq k \leq 224 \end{pmatrix} \quad (5)$$

$$\overline{S'(Gx, t_y)} = \frac{1}{3} \sum_{i=1}^{3} Si(Gxk, t_y) \begin{pmatrix} 65 \leq k \leq 96 \\ 161 \leq k \leq 192 \end{pmatrix}$$

$$\overline{S'(Gx, t_y)} = \frac{1}{4} \sum_{i=1}^{4} Si(Gxk, t_y) \; (97 \leq k \leq 160)$$

After the process for averaging has been effected, the signal processing unit subjects 256 trains of signals $S'(Gx, t_y)$ to the two-dimensional inverse Fourier transformation with Gx and $t_y$ as variables. That is, the nuclear spin distribution $\rho(x, y)$ in the slice is found in compliance with the following equation instead of the equation (2), $$\rho(x, y) = \int\int S'(Gx, t_y) \exp[j\gamma(G_x x t_x + G_y y t_y)] dGx \, dt_y \quad (6)$$

The smaller the absolute value of amplitude of the phase-encoding field Gx according to this embodiment as described above, the more number of times the measurement is repeated to average the measured signals. Thereafter, the nuclear spin distribution is found through the two-dimensional inverse Fourier transformation making it possible to reduce noise in the low frequency components over a space frequency region.

Figure 4:
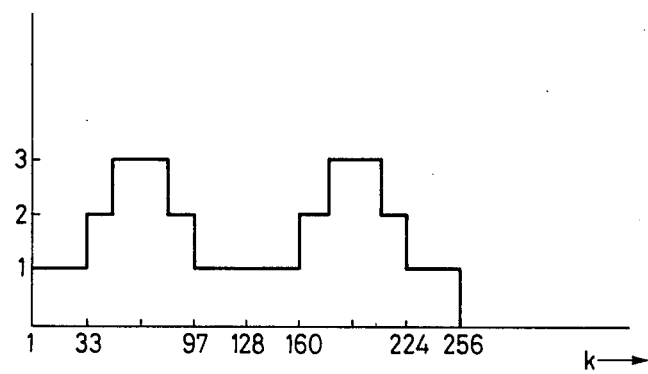

FIG. 4 shows another example of a pattern of the number of times of measurement repetition for each amplitude of the phase-encoding field Gx. In this example, the measurement (addition) when the phase-encoding field Gx has a medium amplitude is repeated in an increased number of times in order to decrease the noise components of medium frequencies in the space frequency region of the obtained image.

Figure 5:
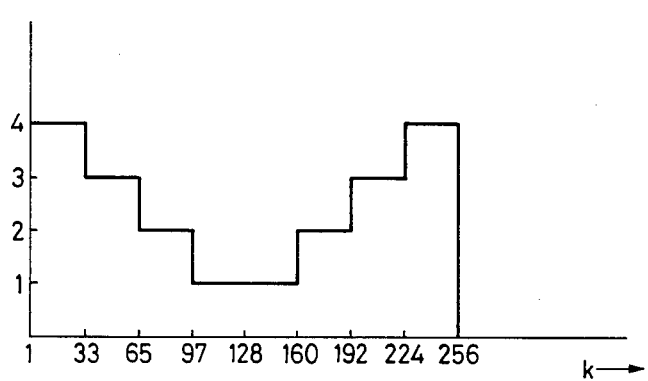

FIG. 5 shows a further example of a pattern of the number of times of measurement repetition for each amplitude of the phase-encoding field Gx. In this example, the measurement (addition) when the phase-encoding field Gx has a large amplitude is repeated in an increased number of times in order to decrease the noise components of high frequencies in the space frequency region of the obtained image.

In order to decrease the noise components in a particular frequency region of space frequency as described above, the measurement should be repeated a plural number of times only for a particular region in the amplitude of the phase-encoding field Gx to obtain an average value of the NMR signals. Therefore, the pattern of the number of times of measurement repetition is symmetrical relative to the central value of amplitude of Gx, i.e., relative to $k = N/2$.

In the foregoing was described the Fourier imaging method in which the measurement was repeated by changing the amplitude of the encoding field Gx. In the Fourier imaging method, however, the same principle holds quite true even when the time $t_x$ for applying the encoding field Gx is successively changed. Even in this case, therefore, the noise components can be reduced in a desired frequency range by adapting the present invention.

FIGS. 6A to 6E illustrate measuring sequences that are repeated according to another embodiment of the present invention. This measuring method is called flash method, and its principle has been described in the Journal of Magnetic Resonance, Vol. 67, 1986, pp. 258–266. First, an RF pulse shown in FIG. 6A is applied simultaneously with the application of gradient field Gz in the z-direction shown in FIG. 6B. The RF pulse is a high-frequency field pulse having a flip angle of smaller than 90°, and a nuclear spin in a particular slice perpendicular to the z-axis is excited at a flip angle smaller than 90°. Then, a phase-encoding gradient field Gxk shown in FIG. 6C is applied. Nearly simultaneously therewith, the gradient field Gy in the y-direction is applied during a period $t_{y1}$ shown in FIG. 6D, and then a read-out gradient field Gy is applied during a period $t_{y2}$ in a direction opposite to that of the period $t_{y1}$. Therefore, the nuclear spin dephased by the gradient field Gy applied during the period $t_{y1}$ is then rephased during the period $t_{y2}$, and the NMR signal shown in FIG. 6E is measured.

The above-mentioned series of measuring sequences is repeated while changing the amplitude of the phase-encoding gradient field Gxk in N different ways. Like in the above-mentioned embodiment, furthermore, the measurement is repeated a plural number of times for each amplitude of the gradient field Gxk in accordance with the pattern of the number of times of measurement repetition shown in FIG. 3, 4 or 5. The NMR signals obtained by the repetition are added up together and averaged for each amplitude of Gxk, and are then subjected to the two-dimensional Fourier transformation quite in the same manner as those of the embodiment of FIGS. 2A to 2E.

According to this embodiment, the time interval for repeating the measurement can be shortened since the nuclear spin after the measurement returns to the thermal equilibrium condition in a shorter period of time than that of the embodiment that employs the measuring sequences shown in FIGS. 2A to 2E. Therefore, there is obtained an image while shortening the whole measuring time and reducing the noise in a desired range of space frequency.

We claim:
1. An NMR imaging method comprising:
 exciting a nuclear spin in a particular region of an object that is placed in a static field;
 applying a phase-encoding gradient field of a predetermined intensity in a first direction for only a predetermined period of time;
 measuring NMR signals from said object under the condition where a signal read-out gradient field is applied in a second direction;
 repeating the procedures of said excitation, application of phase-encoding gradient field and measurement of signals, in such a manner that the intensity or time interval of said phase-encoding gradient field is changed, that the NMR signals are measured for each of a plural of different phase-encoding amounts, and that the NMR signals are measured a plural number of times for a particular phase-encoding amount among said plurality of phase-encoding amounts;

averaging the values of time lapses of NMR signals measured for each of the phase-encoding amounts; and subjecting the data of NMR signals inclusive of said averaged signals to the two-dimensional Fourier transformation with the phase-encoding amount and the lapse of time as variables.

2. An NMR imaging method comprising:

exciting a nuclear spin in a particular region of an object that is placed in a static field;

applying a phase-encoding gradient field of a predetermined intensity in a first direction for only a predetermined period of time;

measuring NMR signals from said object under the condition where a signal read-out gradient field is applied in a second direction;

repeating the procedures of said excitation, application of phase-encoding gradient field and measurement of signals, in such a manner that the intensity or time interval of said phase-encoding gradient field is changed, that the NMR signals are measured for each of a plurality of different phase-encoding amounts, and that the NMR signals are measured for a particular phase-encoding amount among said plurality of phase-encoding amounts in a number of times greater than a number of times for other phase-encoding amounts;

averaging the values of time lapses of NMR signals measured for each of the phase-encoding amounts; and subjecting the data of NMR signals inclusive of said averaged signals to the two-dimensional Fourier transformation with the phase-encoding amount and the lapse of time as variables.

3. An NMR imaging method according to claim 2, wherein the numbers of times of measurement repetition for each of the phase-encoding amounts are symmetrically distributed with the center value of phase-encoding amounts a as a center.

4. An NMR imaging method according to claim 2, wherein the number of times of measurement repetition for the phase-encoding amounts increases toward the center value of the phase-encoding amounts.

5. An NMR imaging method according to claim 1, wherein the number of times of measurement repetition increases as it separates away from the center value of the phase-encoding amounts.

* * * * *

Notice of Adverse Decisions in Interference

In Interference No. 102,009, involving Patent No. 4,740,749, E. Yamamoto, H. Kohno, NMR IMAGING METHOD, final judgment adverse to patentees was rendered July 21, 1991, as to claims 1-5.

*(Official Gazette December 24, 1991).*